United States Patent [19]

Plachno

[11] 4,347,448
[45] Aug. 31, 1982

[54] BUFFER CIRCUIT FOR SEMICONDUCTOR MEMORY

[75] Inventor: Robert S. Plachno, Carrollton, Tex.

[73] Assignee: Mostek Corporation, Carrollton, Tex.

[21] Appl. No.: 265,984

[22] PCT Filed: Nov. 7, 1980

[86] PCT No.: PCT/US80/01495
§ 371 Date: Nov. 7, 1980
§ 102(e) Date: Nov. 7, 1980

[87] PCT Pub. No.: WO82/01795
PCT Pub. Date: May 27, 1982

[51] Int. Cl.³ .................. H03K 17/284; H03K 17/16; H03K 17/687
[52] U.S. Cl. ................................. 307/583; 307/578; 307/594; 365/227
[58] Field of Search ............... 307/296 R, 296 A, 475, 307/481, 482, 578, 583, 584, 594, 597, 200 B; 365/226, 227

[56] References Cited

U.S. PATENT DOCUMENTS

| | | | |
|---|---|---|---|
| 3,778,784 | 12/1973 | Karp et al. | 307/482 X |
| 3,906,464 | 9/1975 | Lattin | 307/269 X |
| 4,019,068 | 4/1977 | Bormann | 307/482 X |
| 4,259,594 | 3/1981 | Fox et al. | 365/227 X |

FOREIGN PATENT DOCUMENTS 54-137246 10/1979 Japan .................. 307/594

OTHER PUBLICATIONS

Gray et al., "Power Supply Stabilization Circuit", *IBM Tech. Discl. Bull.*, vol. 21, No. 4, pp. 1384–1385, 9/78.

*Primary Examiner*—Larry N. Anagnos

[57] ABSTRACT

A buffer circuit (10) receives an enable signal to drive power transfer transistors (12,14) which supply power to circuit elements in a semiconductor memory. When an enable signal is driven to a high state the gate terminals of the power transfer transistors (12,14) will be driven positive thereby rendering the transistors conductive. When the enable signal transitions to a low voltage state first and second clock signals ($\phi$C1 and $\phi$C2) are generated. The action of the clock signals serves to pull a node (20) to one voltage threshold below the reference $V_{ss}$. A second node (64) is driven to two thresholds below the reference of $V_{ss}$. The second node (64) connected to the gate terminal of the power transfer transistors (12,14) to affirmatively hold the power transfer transistors (12,14) in a nonconductive state to essentially block the transfer of any current through these transistors to the circuit elements of the semiconductor memory thereby eliminating any power loss due to current leakage through the power transfer transistors (12,14).

21 Claims, 2 Drawing Figures

BUFFER CIRCUIT FOR SEMICONDUCTOR MEMORY

TECHNICAL FIELD

The present invention pertains to semiconductor memory circuits and more particularly to such a circuit which has a chip enable function to reduce the power consumption of the memory circuit.

BACKGROUND OF THE INVENTION

In many applications for semiconductor memory circuits there is only a limited supply of power available, generally a battery. In other applications the supply of power is not a limiting factor but the heat generated by an integrated circuit must be reduced to a minimum. It is in the practice to "power down" memory circuits when they are not in use to reduce the overall power consumption of a memory system.

In NMOS memory circuits, transistors with very low threshold voltages, low $V_t$ devices, have been used to power switch the positive power supply to the circuit. This reduces the power consumption by a substantial percentage but there is still considerable power consumed by the current leakage through the low $V_t$ devices.

Therefore, there exists a need for a buffer circuit which receives a signal to enable and disable a memory circuit and operates to drive the power transfer transistors in such a manner that the leakage current through these transistors is reduced to essentially zero.

SUMMARY OF THE INVENTION

An illustrative embodiment of the present invention utilizes a method and apparatus for controlling a plurality of power transfer transistors which supply power to operate semiconductor integrated circuits which can be "powered down" when not immediately needed. Circuitry is provided for charging a node which is connected to control the state of the power transfer transistors, the charging of the node carried out in response to a first enable signal. A second enable signal discharges the node down to a predetermined voltage. Further circuitry couples a negatively going clock signal to the node to drive the node to a voltage below the predetermined voltage whereby the power transfer transistors are rendered nonconductive.

BRIEF DESCRIPTION OF THE DRAWINGS

For a more complete understanding of the present invention and the advantages thereof, reference is now made to the following description taken into conjunction with the accompanying Drawings in which.

DETAILED DESCRIPTION OF THE PREFERRED EMBODIMENT

Figure 1:
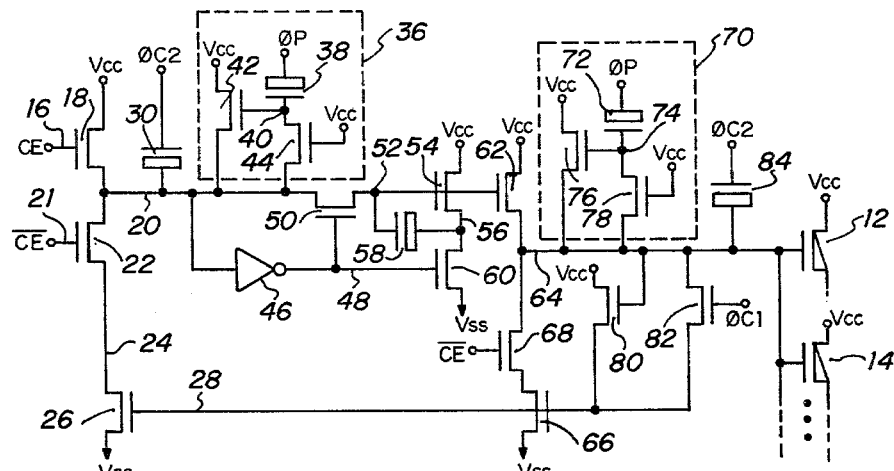
FIG. 1 is a schematic illustration of a chip enable buffer circuit for use in accordance with the present invention.

Referring to FIG. 1 there is illustrated a chip enable circuit 10. The circuit 10 supplies power to various portions of a semiconductor memory circuit (not shown). The power for the various elements in the memory circuit is transferred through a plurality of transistors such as 12 and 14. The transistors 12 and 14 are fabricated to be natural field effect transistors as opposed to being either enhancement or depletion mode transistors. Therefore transistors 12 and 14 have essentially a zero threshold voltage and are turned off when the gate terminal is at essentially zero volts relative to the source terminal. Thus the parts of the semiconductor memory which are powered through the natural transistors 12 and 14 are deactivated whenever the gate terminals of the transistors are driven to zero voltage or below. When the semiconductor memory is being operated in the active mode the gate terminals of transistors 12 and 14 will be driven to essentially the supply voltage $V_{cc}$, but when it is desired to deactivate elements of the semiconductor memory the gate terminals of transistors 12 and 14 will be driven slightly negative to insure that the transistors are fully turned off and that no power is being supplied to the elements in the semiconductor memory. This reduces the total power consumption of the integrated circuit incorporating circuit 10.

The gate terminals of transistors 12 and 14 are connected to a node which is charged to selected voltages to turn transistors 12 and 14 on and off.

Figure 2:
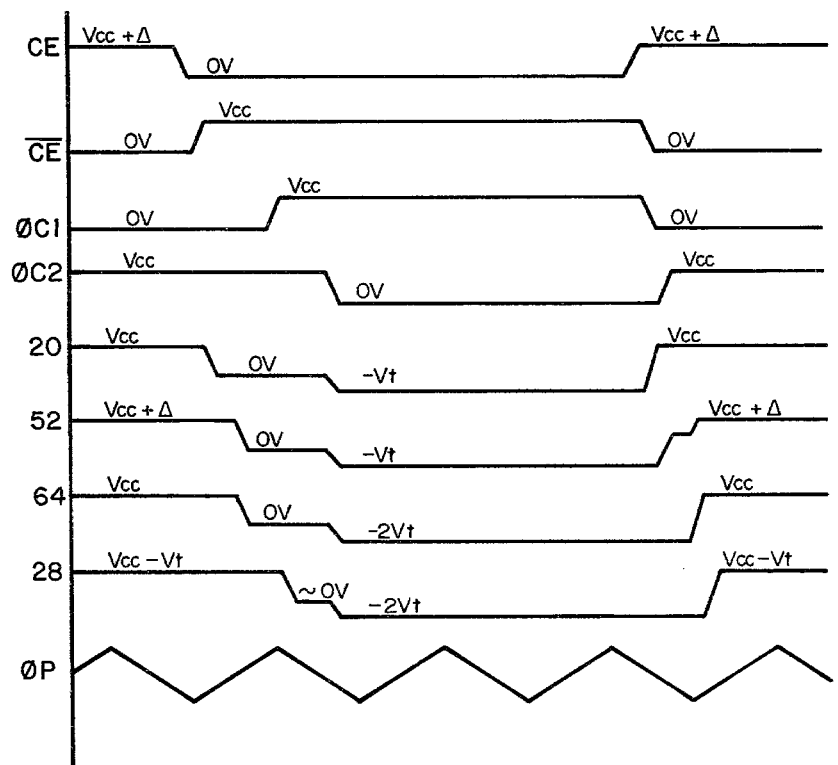
FIG. 2 is an illustration of wave forms at selected nodes for the circuit shown in FIG. 1.

A chip enable (CE) signal is supplied through a line 16 to the gate terminal of a transistor 18. The wave form for signal CE is illustrated in FIG. 2. The drain terminal of transistor 18 is connected to the voltage source $V_{cc}$ and the source terminal of transistor 18 is connected to a node 20.

A signal $\overline{CE}$, which is the inverse of signal CE, is supplied to the gate terminal of a transistor 22. The drain terminal of transistor 22 is connected to node 20 and the source terminal of transistor 22 is connected to a node 24.

A transistor 26 has the drain terminal connected to node 24 and the source terminal connected to a common ground node $V_{ss}$. The gate terminal of transistor 26 is connected to a node 28.

A capacitor 30 is fabricated essentially as a transistor which has the source and drain terminals connected together. The gate terminal forms a first terminal of the capacitor and this gate terminal is connected to receive a clock signal $\phi C2$. The remaining terminal of capacitor 30 is connected to node 20.

A dynamic keeper circuit 36 is provided for node 20. Circuit 36 includes a capacitor 38 which has a gate terminal lead connected to a node 40 and the remaining lead connected to receive an oscillatory signal $\phi_p$. Capacitor 38 is fabricated from an enhancement mode transistor. Signal $\phi_p$ is illustrated in FIG. 2 and is an asynchronous oscillatory signal. A transistor 42 has the gate terminal connected to node 40, the drain terminal is connected to the voltage source $V_{cc}$ and the source terminal is connected to node 20. A transistor 44 has the drain terminal connected to node 40, the gate terminal connected to the source $V_{cc}$ and the source terminal connected to node 20. The keeper circuit 36 holds node 20 at the full supply voltage $V_{cc}$ when the node 20 has previously been driven to a relatively high voltage state, effectively $V_{cc}$. When node 20 is discharged the keeper circuit 36 has essentially no effect on node 20.

When node 20 is at a relatively low voltage such that transistor 44 is turned on, node 40 is held at ground, $V_{ss}$. When node 40 is grounded the signal $\phi p$ cannot charge node 40. But when node 20 is at approximately $V_{cc}$ transistor 44 is turned off and the positive transitions at $\phi p$ are coupled through capacitor 38 to turn on transistor 42 which in turn causes node 20 to be charged to $V_{cc}$.

The input terminal of a Schmitt trigger inverter circuit 46 is connected to node 20 and the output of circuit 46 is connected to a node 48.

A transistor 50 has a source and drain terminals thereof connected between node 20 and a node 52 respectively. The gate terminal of transistor 50 is connected to node 48.

Node 52 is further connected to the gate terminal of a transistor 54 which has the drain terminal connected to $V_{cc}$ and the source terminal connected to a node 56. A capacitor 58 is connected between node 52 and node 56 with the gate terminal of the capacitor connected to node 52. Node 56 is connected to the drain terminal of a transistor 60 which has the gate terminal connected to node 48 and the source terminal connected to the common node $V_{ss}$.

Node 52 is connected to the gate terminal of a transistor 62 which has the drain terminal connected to the voltage source $V_{cc}$ and the source terminal connected to a node 64. A transistor 66 has the gate terminal connected to node 28, the source terminal connected to common node $V_{ss}$. A transistor 68 has the drain and source terminals connected between node 64 and the drain terminal of transistor 66 respectively. The gate terminal of transistor 68 is connected to receive the $\overline{CE}$ signal.

Node 64 is provided with a keeper circuit 70 which is the same as keeper circuit 36 described above. Keeper circuit 70 includes a capacitor 72, a central node 74, a transistor 76 and a transistor 78 which corresponds to capacitor 38, central node 40, transistor 42 and transistor 44 respectively.

A transistor 80 has the gate terminal connected to node 64, the drain terminal connected to the voltage source $V_{cc}$ and the source terminal connected to node 28. A further transistor 82 has the drain terminal connected to node 64, the source terminal connected to node 28 and the gate terminal connected to receive a clock signal $\phi C1$. The gate terminal of a capacitor 84 is connected to receive the clock signal $\phi C2$ and the remaining terminal of capacitor 84 is connected to node 64. Node 64 is further connected to the gate terminals of the natural transistors 12, 14 and others (not shown).

All of the capacitors 30, 38, 58, 72 and 84 are essentially transistors which have the source and drain terminals fixed together and serving a one capacitor terminal with the gate serving as the remaining capacitor terminal.

A number of significant wave forms which are utilized or occur in circuit 10 are illustrated in FIG. 2. These wave forms include the signals CE and $\overline{CE}$ together with the clock signals $\phi C1$ and $\phi C2$. Further wave forms are illustrated to show the voltage levels and transitions at nodes 20, 28, 52 and 64. The oscillatory wave form $\phi_p$ is also illustrated.

Operation of the chip enable buffer circuit of the present invention is now described in reference to FIGS. 1 and 2. As noted above it is the purpose of the circuit 10 to drive the gate terminals of transistors 12 and 14 to at least a slightly negative level, below $V_{ss}$, to insure that these transistors are fully turned off and therefore no current is being supplied to the elements connected to transistors 12 and 14. The gate terminals of transistors 12 and 14 are subsequently driven to a negative level when the signal $\overline{CE}$ goes to a high level.

The signal CE is supplied from a user to the circuit 10 such that a semiconductor memory can be powered down when it is not in use to reduce the power consumption of the overall circuit. Thus the operation of the signal CE is not made synchronous with any particular signal within the overall circuit. The signals CE and $\overline{CE}$ are provided by the external circuitry and may be specified to be less than the full extremes of the supply voltage. Should this be the case the signals CE and $\overline{CE}$ are conditioned to have voltages which are either at the zero voltage level or at $V_{cc}$ or above when input to circuit 10.

The clock signals $\phi C1$ and $\phi C2$ are generated in a time delayed sequence from either the signal CE or the signal $\overline{CE}$. The clock signals $\phi C1$ and $\phi C2$ occur only after the negative transition of the signal CE and the positive transition of signal $\overline{CE}$. The generation of such clock signals is well known in the art.

When the semiconductor memory circuit array (not shown) is fully active the signal CE is in a high state and the signal $\overline{CE}$ is in a low state. At this time the clock signal $\phi C1$ is in a low state and the clock signal $\phi C2$ is at a high state. Node 20 is primarily charged by the action of transistor 18 which is rendered conductive by the signal CE to supply charge from the voltage source $V_{cc}$. The keeper circuit 36 operates to pull the voltage on node 20 up to the full supply voltage $V_{cc}$ and hold it there. During the sequence of operation the node 52 is charged to an incremental voltage $\Delta$ above the voltage source $V_{cc}$ as described below. The high voltage state on node 52 renders transistor 62 conductive to substantially charge node 64. The keeper circuit 70 further pulls the voltage of node 64 to the full supply voltage $V_{cc}$. The node 28 is connected through the transistor 80 to the voltage source $V_{cc}$. The charge or node 64 tends to drive transistor 80 conductive to connect node 28 to $V_{cc}$. But since the gate terminal of transistor 80 is at $V_{cc}$, the voltage on node 28 is held to one threshold voltage $(V_t)$ below the voltage supply $V_{cc}$.

When the signal CE transitions from the high level to the low level the transistor 18 is rendered non-conductive thereby isolating node 20 from the voltage source $V_{cc}$. When the signal $\overline{CE}$ transitions from the low level to the full supply voltage $V_{cc}$, transistor 22 is driven to the conductive state thereby connecting node 20 through transistors 22 and 26 to the common node ground $V_{ss}$. This causes node 20 to be discharged to the zero volt of level $V_{ss}$. When the voltage on node 20 drops to the threshold of circuit 46 the output of circuit 46 transitions from a low to a high level thereby driving transistor 50 to be conductive. This connects node 20 to node 52 thereby causing node 52 to also be discharged.

The signal $\overline{CE}$ is also supplied to the gate terminal of transistor 68 to drive this transistor conductive which then provides a path from the node 64 through transistor 68 and 66 to $V_{ss}$. Thus node 64 is discharged when signal $\overline{CE}$ transitions to a high voltage state.

Transistors 26 and 66 remain conductive as long as node 28 is charged. But when the clock signal $\phi C1$ transitions from the low to the high voltage state transistor 82 is turned on thereby connecting node 28 to node 64. Since node 64 has previously been discharged and is connected to ground, node 28 will likewise be discharged and pulled to essentially a zero volt level. As node 28 is being discharged transistors 26 and 66 will be turned off.

At this point in the cycle nodes 20, 52, 64 and 28 have been discharged. Nodes 20 and 52 are connected to each other but isolated from the remainder of the circuit while node 64 is also isolated.

When the clock signal φC2 makes a negative transition nodes 20 and 52 will be driven negative by capacitive coupling through capacitor 30. Node 20 can be driven negative for only one $V_t$ below $V_{ss}$ due to the action of transistor 18. If node 20 should go any lower than one $V_t$ below $V_{ss}$ transistor 18 would be rendered conductive thereby pulling node 20 back up in voltage until transistor 18 is again turned off. Thus node 20 is clamped at 1 $V_t$ below zero volts, wherein $V_{ss}$ is defined as zero volts. At this time nodes 20 and 52 are connected because transistor 50 is rendered conductive by the output signal produced by circuit 46. Thus, node 52 is driven to the same voltage state as node 20.

Node 64 is likewise driven negative by the operation of the clock signal φC2 working through capacitor 84. Node 64 is driven to two voltage thresholds below $V_{ss}$. This is a result of the gate terminal of transistor 62 being held at 1 $V_t$ below $V_{ss}$. Node 64 can be driven to only one more $V_t$ below the zero voltage of $V_{ss}$ since to drive this node any further negative would cause transistor 62 to become conductive and pull the voltage on node 64 upward. Thus node 64 is clamped at a voltage of 2 $V_t$ below $V_{ss}$.

Since node 64 is connected to the gate terminals of transistors 12, 14 and other similar transistors, these natural transistors will be affirmatively turned off thereby preventing essentially any current flow to the elements connected to these transistors.

When signal CE transitions from the low state to the high state transistor 18 is rendered conductive thereby charging node 20 to essentially $V_{cc}$. The keeper circuit 36 will again insure that node 20 is pulled to the full voltage supply $V_{cc}$.

As the voltage on node 20 rises the Schmitt trigger inverter circuit 46 drives its output to a low level thereby turning off transistors 50 and 60. The delay due to the hystersis of circuit 46 permits node 52 to be charged before transistor 50 is turned off. This serves to isolate node 20 from node 52 and to disconnect the capacitor 58 from connection to the ground node $V_{ss}$. When node 52 rises in voltage, transistor 54 will be rendered conductive and the source terminal of transistor 54 will be pulled to near the supply voltage $V_{cc}$. This sudden rise in voltage at node 56 causes a coupling effect through capacitor 58 which causes node 52 to be elevated above the supply voltage $V_{cc}$ by a voltage differential Δ. The capacitive coupling effect is shown as a small step in the positive going section of the wave form for node 52 in FIG. 2.

When node 52 is driven to a high level, transistor 62 will be rendered conductive thereby charging node 64 to essentially the supply voltage $V_{cc}$. The keeper circuit 70 will pull the node 64 to the full supply voltage $V_{cc}$.

When node 64 is driven to a higher voltage state, transistor 80 is turned on thereby charging node 28 to one voltage threshold below $V_{cc}$.

A full cycle of operation has thus been described for circuit 10 wherein the semiconductor memory has gone from the state of being enabled to being disabled and back to being enabled. During the disabled state the natural transistors which supply current to various portions of the semiconductor memory are solidly turned off thereby preventing any power consumption by these circuit elements.

Although one embodiment of the invention has been illustrated in the accompanying drawings and described in the foregoing detailed description, it will be understood that the invention is not limited to the embodiment disclosed, but is capable of numerous rearrangements, modifications and substitutions without departing from the scope of the invention as determined by the following claims.

I claim:

1. A circuit for controlling a plurality of power transfer transistors, comprising:
   means responsive to a first enable signal for charging a node which is connected to control the state of said power transfer transistors;
   means responsive to a second enable signal for coupling said node to a reference voltage and for discharging said node to a predetermined voltage;
   means responsive to a first clock signal for isolating said node from said reference voltage; and
   means for coupling a negatively going clock signal to said node to drive said node to a voltage below said predetermined voltage whereby said power transfer transistors are rendered nonconductive.

2. A buffer circuit comprising:
   means for charging a first node;
   means for charging a second node;
   means responsive to a first signal for discharging said first and second nodes;
   means responsive to a second signal for isolating said first and second nodes;
   means for capacitively coupling a negative-going signal to said first and second nodes to lower the voltages on said nodes; and
   means for coupling said first and second nodes such that said second node is driven by said negative-going signal to a lower voltage than said first node.

3. A circuit for controlling a plurality of power transfer transistors, comprising:
   means responsive to a first enable signal for charging a first node, said first node connected to said power transfer transistor and a second node;
   means responsive to a second enable signal for discharging said first and said second nodes;
   means for coupling a negative-going clock signal to said first and second nodes to drive said first and second nodes to lower voltages; and
   means for coupling said first node to said second node such that said second node can be driven to a more negative voltage than said first node.

4. The circuit recited in claim 3 including means for coupling said first node to a power node such that said first node is clamped such that it can be driven negative by no more than a predetermined voltage below a common voltage.

5. The circuit recited in claim 3 wherein said means for coupling said first node to said second node comprises a transistor having the drain terminal connected to a power node, the gate terminal coupled to said first node and the source terminal connected to said second node.

6. A circuit comprising:
   means responsive to an enable signal for charging a first node;
   means for charging a second node;
   means for charging a third node;
   means for charging a fourth node;
   means responsive to an inverse signal of said enable signal for discharging said first, second and third nodes;

means responsive to a first clock signal for discharging said fourth node;

means responsive to a second clock signal for negatively driving the voltage on said first node;

means responsive to said second clock signal for negatively driving the voltage on said third node; and means for coupling said first node and said third node to permit said third node to be driven to a more negative voltage than said first node.

7. The circuit recited in claim 6 wherein said means for charging a first node comprises a transistor having the gate terminal thereof connected to receive said enable signal, the drain terminal thereof connected to a power node and the source terminal thereof connected to said first node.

8. The circuit recited in claim 6 wherein said means for charging a second node comprises:
a Schmitt trigger circuit having the input thereof connected to said first node;
a first transistor having the drain and source terminals connected between said first and second nodes and the gate terminal thereof connected to the output of said Schmitt trigger circuit;
a second transistor having the gate terminal connected to the output of said Schmitt trigger circuit, the drain terminal connected to a fifth node and the source terminal connected to a common node;
a capacitor connected between said second node and said fifth node; and
a third transistor having the gate terminal connected to said second node, the drain terminal connected to a power node and the source terminal connected to said fifth node.

9. The circuit recited in claim 6 wherein said means for charging a third node comprises a transistor having the gate terminal connected to said second node, the drain terminal connected to a power node and the source terminal connected to said third node.

10. The circuit recited in claim 6 wherein said means for charging a fourth node comprises a transistor having the drain terminal connected to a power node, the source terminal connected to said fourth node, and the gate terminal connected to said third node.

11. The circuit recited in claim 6 wherein said means for discharging said first, second and third nodes comprises:
a first transistor having the drain terminal connected to said first node and the gate terminal connected to receive said inverse signal;
a second transistor having the drain terminal connected to said third node and the gate terminal connected to receive said inverse signal;
a third transistor having the drain terminal connected to the source terminal of said first transistor the source terminal connected to a common node and the gate terminal connected to said fourth node; and
a fourth transistor having the drain terminal connected to the source terminal of said second transistor the source terminal connected to said common node and the gate terminal connected to said fourth node.

12. The circuit recited in claim 6 wherein said means for discharging said fourth node comprises a transistor having the drain and source terminals connected between said third and fourth nodes and the gate terminal connected to receive said first clock signal.

13. The circuit recited in claim 6 wherein said means for negatively driving the voltage on said first node comprises a first capacitor having a first terminal connected to said first node and a second terminal connected to receive said second clock signal.

14. The circuit recited in claim 6 wherein said means for negatively driving said third node comprises a second capacitor having a first terminal connected to said third node and the second terminal connected to receive said second clock signal.

15. The circuit recited in claim 6 wherein said means for coupling comprises a transistor having the drain terminal connected to a power node, the source terminal connected to said third node and the gate terminal connected to said second node.

16. The circuit recited in claim 6 including a keeper circuit for each of said first and third nodes, said keeper circuits connected respectively to said corresponding nodes for pulling the nodes connected thereto to a high voltage state when the corresponding node is at a voltage above a predetermined threshold.

17. A circuit for controlling a plurality of power transfer transistors, comprising:
a first transistor for charging a first node, said first transistor having the drain terminal connected to a power node, the gate terminal connected to receive a first enable signal, and the source terminal connected to a fist node;
a second transistor for interconnecting said first node to a second node, said second transistor having the drain and source terminals connected between said first and second nodes;
a Schmitt trigger inverter circuit having the input connected to said first node and the output connected to the gate terminal of said second transistor;
a third transistor having the drain terminal connected to said power node and the gate terminal connected to said second node;
a first capacitor having the terminals thereof connected between said second node and the source terminal of said third transistor;
a fourth transistor having the drain terminal connected to the source terminal of said third transistor, the gate terminal connected to the gate terminal of said second transistor and the source terminal connected to a common node;
a fifth transistor for coupling said second node to a third node, said fifth transistor having the drain terminal connected to said power node, the gate terminal connected to said second node and the source terminal connected to said third node;
a sixth transistor having the drain terminal connected to said third node and the gate terminal connected to receive an inverse signal of said enable signal;
a seventh transistor having the drain terminal connected to the source terminal of said sixth transistor, the gate terminal connected to a fourth node and the source terminal connected to said common node;
an eighth transistor for charging said fourth node, said eighth transistor having the drain terminal connected to said power node, said gate terminal connected to said third node and the source terminal connected to said fourth node;
a ninth transistor for connecting said third and fourth nodes, said ninth transistor having the drain terminal connected to said third node, the gate terminal connected to receive a first clock signal and the source terminal connected to said fourth node;

a tenth transistor for discharging said first node, said tenth transistor having the drain terminal connected to said first node, the gate terminal connected to receive said inverse signal;

an eleventh transistor having the drain terminal connected to the source terminal of said tenth transistor, the gate terminal connected to said fourth node and the source terminal connected to said common node;

a second capacitor having a first terminal connected to said first node and a second terminal connected to receive a second clock signal which drives the voltage of said first node negatively when said second clock signal has a negative-going transition;

a third capacitor having a first terminal connected to said third node and second terminal connected to receive said second clock signal which drives the voltage of said third node negatively when said second clock signal has a negative-going transition;

a first keeper circuit connected to said first node for maintaining said first node at essentially the voltage of said power node when said first node has been driven to a voltage above a preset voltage; and a second keeper circuit connected to said third node for maintaining said third node at essentially the voltage of said power node when said third node has been driven to a voltage above a preset voltage.

18. A method for controlling a plurality of power transfer transistors, comprising the steps of:
charging a node in response to a first enable signal;
discharging said node to a predetermined voltage in response to a second enable signal; and
coupling a negatively-going clock signal to said node to drive said node to a voltage below said predetermined voltage whereby said power transfer transistors are rendered nonconductive.

19. A method for controlling a plurality of power transfer transistors, comprising the steps of:
charging first and second nodes in response to a first enable signal;
discharging said first and second nodes in response to a second enable signal;
coupling a negatively-going clock signal to said first and second nodes to drive said first and second nodes to lower voltages;
clamping said first node such that the voltage on said first node does not go below a first limit voltage when said first node is driven negative by said clock signal; and
clamping said second node such that the voltage on said second node does not go below a second limit voltage when said second node is driven negative by said clock signal, said second limit voltage more negative than said first limit voltage.

20. A method for controlling a plurality of power transfer transistors, comprising the steps of:
charging a first node in response to a first enable signal;
charging a second node by coupling said second node to said first node;
charging a third node in response to the charging of said second node;
charging a fourth node in response to the charging of said third node;
discharging said first node to a common ground node in response to a second enable signal;
discharging said second node to said ground node in response to the discharging of said first node;
discharging said third node to said ground node in response to said second enable signal;
discharging said fourth node to said ground node in response to a first clock signal;
isolating said first, second and third nodes in response to the discharge of said fourth node;
capacitively coupling a second, negatively-going clock signal to said first node and said third node to drive the voltages negatively on said first and third nodes;
clamping the negatively driven voltage on said first node at essentially one transistor threshold voltage below ground potential; and
clamping the negatively driven voltage on said third node at essentialy two transistor threshold voltages below said ground potential to affirmatively render nonconductive said power transfer transistors which are connected to said third node.

21. The method recited in claim 20 including the steps of:
pulling said first node to the voltage of a power supply node when said first node is at a voltage above a predetermined voltage; and
pulling said third node to the voltage of said power supply node when said third node is at a voltage above a predetermined voltage.

* * * * *